(12) United States Patent
Staeblein et al.

(10) Patent No.: US 7,837,969 B2
(45) Date of Patent: Nov. 23, 2010

(54) METHOD OF MAKING LARGE-VOLUME $CAF_2$ SINGLE CRYSTALS FOR OPTICAL ELEMENTS WITH AN OPTIC AXIS PARALLEL TO THE (100)-OR (110)-CRYSTAL AXIS AND $CAF_2$ SINGLE CRYSTAL MADE THEREBY

(75) Inventors: Joerg Staeblein, Jena (DE); Lutz Parthier, Kleinmachnow (DE)

(73) Assignee: Hellma Materials GmbH & Co. KG, Jena (DE)

( * ) Notice: Subject to any disclaimer, the term of this patent is extended or adjusted under 35 U.S.C. 154(b) by 0 days.

(21) Appl. No.: 12/410,912

(22) Filed: Mar. 25, 2009

(65) Prior Publication Data
US 2009/0180948 A1 Jul. 16, 2009

Related U.S. Application Data

(62) Division of application No. 11/063,210, filed on Feb. 22, 2005.

(30) Foreign Application Priority Data
Feb. 23, 2004 (DE) .................. 10 2004 008 752

(51) Int. Cl.
*C30B 13/00* (2006.01)

(52) U.S. Cl. ............. 423/490; 117/81; 117/83; 117/202; 117/204; 117/206; 438/689; 219/407; 373/119; 373/137

(58) Field of Classification Search ............ 423/490; 117/81, 83, 202, 204, 206; 438/689; 219/407; 373/119, 137
See application file for complete search history.

(56) References Cited

U.S. PATENT DOCUMENTS

| | | | |
|---|---|---|---|
| 6,364,946 B2 * | 4/2002 | Staeblein et al. | 117/81 |
| 6,624,390 B1 * | 9/2003 | Motakef et al. | 219/407 |
| 6,669,778 B2 * | 12/2003 | Meyer-Fredholm | 117/81 |
| 2002/0182863 A1 * | 12/2002 | Chiba | 438/689 |
| 2002/0185057 A1 * | 12/2002 | Garibin et al. | 117/94 |
| 2004/0016743 A1 * | 1/2004 | Motakef et al. | 219/385 |
| 2005/0241570 A1 * | 11/2005 | Lebbou et al. | 117/81 |

FOREIGN PATENT DOCUMENTS

EP 1382722 * 1/2004

* cited by examiner

*Primary Examiner*—Steven Bos
(74) *Attorney, Agent, or Firm*—Michael J. Striker

(57) ABSTRACT

The method of making a single crystal, especially a $CaF_2$ single crystal, includes tempering, in which the crystal is heated at <18 K/h to a temperature of 1000° C. to 1350° C. and held at this temperature for at least 65 hours with maximum temperature differences within the crystal of <0.2 K. Subsequently the crystal is cooled with a cooling rate of at maximum 0.5 K/h above a limiting temperature between 900° C. to 600° C. and then further below this limiting temperature at maximum 3 K/h. The obtained $CaF_2$ crystals have refractive index uniformity <0.025×10$^{-6}$ (RMS) in a (111)-, (100)- or (110)-direction and a stress birefringence of less than 2.5 nm/cm (PV) and/or a stress birefringence of less than 1 nm/cm (RMS) in the (100)- or (110)-direction. In the (111)-direction the stress birefringence is <0.5 nm/cm (PV) and/or the stress birefringence is <0.15 nm/cm (RMS).

14 Claims, No Drawings

METHOD OF MAKING LARGE-VOLUME CAF$_2$ SINGLE CRYSTALS FOR OPTICAL ELEMENTS WITH AN OPTIC AXIS PARALLEL TO THE (100)- OR (110)-CRYSTAL AXIS AND CAF$_2$ SINGLE CRYSTAL MADE THEREBY

CROSS-REFERENCE

This is a divisional of U.S. patent application Ser. No. 11/063,210, filed on Feb. 22, 2005. The invention described and claimed herein below is also described in the aforesaid U.S. patent application, which provides the basis for a claim of priority of invention under 35 U.S.C. 120.

BACKGROUND OF THE INVENTION

1. Field of the Invention

The present invention relates to a method of making optical components or elements from CaF$_2$ with parallel (100)- or (110)-oriented optic axes (principle direction) by tempering at elevated temperatures and suitably adapted cooling, The invention also relates to the CaF$_2$ crystals made by the method and to the optical components made from the crystals.

2. Related Art

Calcium fluoride is used as material for optical components for VUV-applications in microlithography, like a wafer stepper or excimer laser. The crystals are the starting material for making lenses, prisms and other components, which are used in optics for imaging the smallest of structures for making integrated circuits, e.g. computer chips. In order to attain the required imaging quality, this optical material has very high specifications. Conventionally the non-uniformity of or variations in the refractive index $\Delta n$ should be no more than $1 \times 10^{-6}$ and the stress birefringence must be clearly below 1 nm/cm.

The stress optical tensor gives the connection between the mechanical variables (such as stress) and the optical effects caused by them (such as the stress birefringence SDB) in crystals (direction-dependent). That means that stresses of equal magnitude in single crystal material can lead to clearly different stress birefringence and non-uniformities in the index of refraction depending on the crystallographic orientation and/or the observation direction. For these reasons up to now components were used in the application or usage direction, in which the minimal stress birefringence is observed. For calcium fluoride crystals that direction is the (111)-direction. Thus currently materials for lens blanks are used exclusively in the (111)-orientation (and/or near the (111)-direction for cubes).

The experiments of J. H. Burnett, Z. H. Levine, E. L. Shirley, described in "Intrinsic birefringence in calcium fluoride and barium fluoride", Physical Rev. B 64 (2001), 241102 have shown that calcium fluoride has an intrinsic birefringence. This effect strongly increases near the band edge of the material and leads to significant imaging errors using application wavelengths of 157 nm. In order to compensate for the intrinsic birefringence, the objective manufacturer combines lenses of different crystal orientation. Furthermore the lens blanks, rectangular prisms and prisms in general must be made in different crystal orientations, particularly in the (100)-orientation and (110) orientation.

The specifications for not-(111)-oriented products regarding the optical quality, particularly the index of refraction uniformity and the stress birefringence, are comparable with the specifications, which are required of (111)-material. Generally these specifications regarding the quality for not-(111)-oriented products are not equally difficult to attain. The residual stresses in material for (100) products and/or (110)-oriented products are generally about 80 to 90% less than for (111)-oriented products, in order to attain the same stress double refraction or birefringence.

Various possibilities for making single crystals for use as optical elements are known and the principles regarding this use of single crystals are described, e.g., in the textbook Wilke-Bohm, "Crystal Growth (Kristallzüchtung)", Harri Deutsch Press, ISBN 3-87144-971-7. Single crystals can be made from the gas phase, the melt, solution or a solid phase by diffusion and/or re-crystallization processes according to very different methods.

Suitable CaF$_2$ blanks or semi-finished elements are made in a multi-step process. The prerequisite is to provide a CaF$_2$ powder as starting material, which meets the highest specifications for chemical purity. Traces of critical cations and/or anions may only be contained in sub-ppm amounts or for less crucial purities up to a few ppm. This powder is usually subjected to a drying stage in vacuum. Interfering residual oxygen is removed from the CaF$_2$ by means of an added second material, by a subsequent heating by means of a so-called scavenger reaction. Scavenger substances are, e.g. ZnF$_2$, PbF$_2$ or other suitable fluorides or fluorine-containing gas.

The conventional methods for making calcium fluoride single crystals on an industrial scale include, e.g. the Bridgman-Stockbarger method, the Vertical Gradient Freeze method, the Naken-Kyropoulos method and the Czochralski method. In these methods polycrystalline material is melted in a vessel or crucible. Subsequently the melt is very slowly allowed to solidify in a directed manner, in order to allow the crystals to form. Subsequent cooling must be conducted so that as little as possible thermal stresses, which produce crystal defects, are generated in the crystal.

To fulfill the high specifications for VUV applications the crystals or parts of them undergo a further temperature treatment below the melting point in order to reduce crystal defects and attain a reduced stress birefringence and high refractive index uniformity. During this process characterized as tempering the still-present defects such as dislocations or small angle grain boundaries are clearly reduced at the elevated temperature in the crystal by mechanical deformation and diffusion processes. The subsequent cooling stage entirely determines the obtained quality level.

The tempering can be performed as a process step directly in the crystal growth apparatus or also as a separate process in a special oven.

Typical procedures for tempering calcium fluoride were already described in EP 0 939 147 A2 or in U.S. Pat. No. 6,332,922 B1. Especially special temperature and time conditions are described for improving the stress birefringence and index of refraction uniformity of calcium fluoride crystals. However the described methods do not provide crystals, which have the required quality to fulfill the actual specifications for microlithography with wavelengths of 193 nm and/or 157 nm, which have developed in the meantime.

The (111)-orientation is preferred for blanks or semi-finished articles based on the anisotropy of the optical stress properties according to the disclosures in EP 0 942 297 A2. The (111)-, (100)- and (110)-directions were tested. It was found that only the (111)-disk had stress birefringence values approximately in the required range when CaF$_2$ disks having the different directions were tested under the same heat treatment conditions.

For BaF$_2$ disks it was shown that the attained reduction of the stress birefringence for the (111)-oriented disks was substantially greater than that obtained for disks that are not in the (111)-orientation.

As is the case with CaF$_2$ the required quality cannot currently be attained with an optical principle direction that is different from (111).

SUMMARY OF THE INVENTION

It is an object of the present invention to provide calcium fluoride crystals of optical quality, which is required for applications with an optical principle direction different from the (111)-crystal axis, especially along the (100)- or (110)-axis, in microlithography, especially at wavelengths below 250 nm, particularly at 193 nm or shorter, by tempering at elevated temperatures in a suitable oven.

It is a further object of the present invention to minimize residual stress and non-uniformities in the crystal material, in order to obtain a low-defect crystal with the smallest possible residual stresses, whose stress birefringence is greater than 1 nm/cm in no direction and whose refractive index uniformity $\Delta n$ is less than $5*10^{-7}$ in every direction, by deformation and curing processes in the crystal at elevated temperatures.

Another object of the present invention is to not only prevent a reduction of light transmission at wavelengths under 250 nm or of 193 nm or shorter in comparison to not tempered raw material, but in contrast to even attain an improvement by the temperature treatment (tempering). Moreover it is necessary to prevent formation of absorption and scattering centers during the temperature treatment.

Also avoiding the formation and removing of new so-called glide bands is another aim of the present invention Glide bands are typically crystal defects, which arise by a uniform plastic deformation along a material-type deformation plane and direction and which have locally a very high dislocation density in comparison to their surroundings and lead to optical non-uniformities and stress birefringence.

These objections are attained by the methods described in the appended claims.

It has been shown that the crystal defects in CaF$_2$ may be sufficiently reduced in order to attain the above-desired objects when the crystal is heated to temperatures over 1000° C. and held or maintained at the set temperature for at least 65 hours, preferably at least 75 hours. However holding times of at least 80 hours are particularly preferred. According to the invention it has been found that opposite to the current notions these extended holding times are required in contrast to the currently known processes, in order to allow sufficient time for the required relaxation processes in the crystals.

The set holding temperature according to the invention is at least 1000° C., preferably at least 1050° C. However temperatures of at least 1080° C. or 1100° C. are particularly preferred. An appropriate upper limit for the holding temperature is a maximum of 1350° C., especially 1300° C. However a maximum temperature of 1250° C. or 1200° is especially preferred. It has also proven advantageous according to the invention to ensure that there are no or only minimal temperature differences within the crystal during the holding time, i.e. temperatures throughout the entire crystal volume are as nearly equal or uniform as possible.

The extreme requirements for freedom from stress in the crystal are especially fulfilled when the static temperature gradients in the apparatus are reduced as well as the dynamic temperature gradients. The static temperature gradients are caused by the spatial temperature distribution (oven design) in the tempering oven. They occur during the holding time interval. Dynamic temperatures gradients occur in the tempering material, when heat from the outside (oven) is supplied or removed. Heat transport depends on temperature gradients in the material. The magnitudes of these gradients are essentially determined by heat up and cool down speed. These gradients are described here as "dynamic temperature gradients". These types of gradients are superimposed on each other during the heat up and cool down stages.

After the heat up, i.e. during the holding time at the maximum tempering temperature static temperature gradients in the radial or axial direction form in the tempering chamber or space. These gradients are limited to a maximum of 0.2 K/cm by the oven configuration according to the invention. Preferably however static radial temperature gradients in the tempering space of less than 0.013 K/cm and static axial temperature gradients in the tempering space of less than 0.07 K/cm are guaranteed.

Preferably the curing process takes place in an apparatus, which produces a temperature field with a temperature gradient of at most 0.2 K/cm, in a region in which the material to be tempered is located.

The apparatus should preferably exclusively comprise highly pure graphite in its interior, in order to prevent contamination of the CaF$_2$ crystals, which can lead to a reduction of the transmission. Preferred graphite, which comes into contact with CaF$_2$, has a residual ash content of less than 20 ppm.

The purity requirements likewise extend to the products to be tempered. Thus prior to coating the apparatus the parts are subjected to a careful purification. The parts should be both fat-free and dust-free, and have no surface moisture or as little surface moisture as possible. A purification of the parts with fat-dissolving organic solvent at high vapor pressure is preferred. After a successful purification, contact with the parts with bare skin or dirty objects is to be avoided.

At least one scavenger material is preferably used to remove the residual oxygen present in the apparatus, on the crystal surfaces and/or in the crystal lattice. Compounds, such as ZnF$_2$, PbF$_2$, XeF$_2$ and SnF$_2$, which are used as solids, have proven to be suitable. It is also possible to use a gaseous scavenger after a drying stage. Especially fluorine gas, fluorine gas/inert gas mixture, fluorocarbon gases and/or fluorohydrocarbon gas are preferable for use as gaseous scavengers. A combination of solid and gaseous scavengers can also be used.

In a preferred embodiment the tempering is performed using a gaseous scavenger. Fluorine-containing or fluorocarbon gases, for example, CF$_4$, C$_2$F$_6$, C$_3$F$_8$ or CHF$_3$, SF$_6$ or NF$_3$, are mixed in a concentration of 1 to 50%, especially 5 to 30%, and more preferably 5 to 15%, with an inert gas to form a preferred scavenger gas in the apparatus. Surprisingly the transmission of the CaF$_2$ is increased by the use of this sort of scavenger gas. This effect is not achieved using inert gas, vacuum or powdery scavenger material.

In an especial preferred embodiment a gas mixture for tempering with the above-described composition may flow through the apparatus with a flow rate of a few liters per minute during the tempering stage.

Special care regarding purity and freedom from oxygen of all materials and surfaces found in the apparatus can be left to the scavenger material. First drying is performed in a high vacuum in order to completely remove surface water and oxygen. The tempering can occur in vacuum, but also in an inert gas atmosphere.

The requirements for purity of the solid scavenger materials are essentially the same as for the CaF$_2$. If, for example, PbF$_2$ is used as scavenger with the elements Na, Mg, Sr, Ba, Al and the transition metals purity specifications are kept below 1 ppm for each element.

To avoid contamination, which can ultimately lead to reduction in transmission, it has been shown that the gas used should have a purity of at minimum 99.999%, preferably better than 99.9999%.

The tempering is preferably performed in a reducing atmosphere independent of the materials and the pressure present in the apparatus.

In a special embodiment of the invention additional $CaF_2$ powder is introduced into the tempering vessel. In a further embodiment according to the invention a crystal with a larger volume than its desired final size or with greater dimensions than its final dimensions is tempered and after tempering the excess material is removed. The tempering itself usually occurs in an oven and/or other apparatus suitable for this purpose. Preferably so much edge volume is removed in that apparatus that the crystal is already at its final dimensions or size. Material is preferably removed from the crystal center region along the periphery and/or circumferential outer edge to reduce its height and/or its diameter. In a preferred embodiment the increase over the final dimensions of the crystal amounts to at least 5%, preferably 10%, of the final dimensions. An increase in dimensions of +15%, and especially of +20%, is even more preferable. An increase of +25 or +30% is especially preferred. The percentage increase in dimensions preferably concerns the diameter and/or height of the crystal. For example, should a final dimension of the finished crystal be 20 cm, the crystal that is tempered should have a 20% increase in this dimension, e.g. it should have a diameter of at least 24 cm. The later tempering of the crystal after removal of the edge regions, which produces interior elastic residual stress in the crystal, should not take place.

RMS values of refractive index uniformity of better than $0.025 \times 10^{-6}$ especially better than $0.015 \times 10^{-6}$, can be obtained in $CaF_2$ crystals by the procedure according to the invention. Values of the stress birefringence (SDB) in nm/cm for these $CaF_2$ crystals are listed in the following Table I.

In the case of $CaF_2$ the principle glide plane is the (100) plane. If the maximum temperature gradient occurs parallel to or perpendicular to the surface of the 100-disk, the stresses are completely effective in the glide system. By tilting the disk orientation the effective stresses are reduced. In the case of the (111)-orientation (the angle between the 111-surface and the 100-glide plane amounts to 54.73°) these effective stress components are clearly reduced. The best conceivable case in this sense would be a (110)-orientation. In this case however the second (auxiliary)-glide system with 110 as glide system would be extremely well oriented and activated.

The angle between the glide direction and the direction of maximum temperature gradient is preferably greater than 10°. For $CaF_2$ crystals and structures comparable to them angles of from 25° to 36° are especially preferred.

In other crystal systems also larger angles can be attained. According to the teaching of the present invention it is preferable to adjust the angle between the glide direction and the direction of the temperature gradient so that it is as large as possible.

In an especially preferred embodiment the crystal is tempered in its (111)-orientation and of course so that its (111)-axis is parallel to the axis of the tempering oven that is use. Thus it is preferred that the radial temperature gradient produced in the tempering oven is directed parallel to the earth's surface, i.e. perpendicular to the direction in which gravity acts.

The spatial temperature distribution throughout the entire crystal volume results from an overlap of a static temperature gradient (apparatus-dependent temperature distribution) with a dynamic temperature gradient, which arises because of the heating up and cooling down of the crystal. The former dominates the holding time, the latter comes into play during the heat up and cool down of the crystal.

It is imperative for the tempering according to the invention that the heat supplied from the outside to the crystal during heating of the crystal produces a small temperature gradient,

TABLE I

| STRESS BIREFRINGENCE (in nm/cm) VERSUS ORIENTATION | | | | |
|---|---|---|---|---|
| | <111>-orientation, preferred | <111>-orientation, especially preferred | <100> or <110>-orientation, preferred | <100> or <110>-orientation, especially preferred |
| SDB-PV value | 0.5 | 0.2 | 2.5 | 1 |
| SDB-RMS value | 0.15 | 0.08 | 1 | 0.35 |

The method according to the invention is suitable for making crystals of all shapes and all orientations. Thus, for example, without more it is possible to obtain crystals which are approximately stress-free in the (100)- or (110)-direction instead of the (111)-direction, which was not possible up to now with the prior art methods.

In a preferred embodiment according to the invention a small temperature gradient is produced during tempering, which is oriented at an angle of at least 5° to the glide plane.

The direction of the maximum temperature gradient is at the same time the direction of the highest stresses. Since the crystal experiences a plastic deformation only along a definite glide direction on a definite glide plane only the stress acting to deform the crystals in this glide system is relevant for the deformation.

which is not too large. This gradient should be such that temperature differences between different points in the crystal amount to no more than 5° C. Preferably the upper limit of the temperature difference is at most 2° C., but a maximum of 1° C. is especially preferred. It is also preferred that these maximum temperatures differences do not occur in an interior volume region of the crystal, i.e. in a region which is spaced a distance of at least 10% of the crystal diameter from the crystal edge. Slightly higher temperature differences than the above-mentioned differences can exist in this edge region, although that is not preferable.

The extreme requirements for freedom from stress in the crystal are especially fulfilled when the dynamic temperature gradients during the heat up stage and, to the extent that it is still significant, during the cooling stage are reduced so that they are the same or only not significantly greater than the static temperature gradients during the holding time at the maximum temperature.

Preferably the curing process runs in an apparatus, which guarantees static radial temperature gradients of less than 0.013 K/cm and static axial temperature gradients of less than 0.07 K/cm in the region, in which the material to be tempered is located.

In a preferred embodiment of the invention during tempering the crystal is covered by a graphite member. The graphite member preferably comprises a graphite mat or a graphite plates. The graphite plate assists in reducing the temperature gradients in the tempering material, since uniform heat transfer occurs to and from the crystal. The graphite cover has good heat conductivity. It is preferable to perform the tempering by means of heating elements or sources arrange laterally in the oven so that the resulting gradients in the crystal are lateral, i.e. parallel to the earth's surface. However it is also possible to perform the heating during tempering by means of top and bottom heaters; in this latter type of heating it has proven to be appropriate to put especially good heat conducting graphite plates on the crystal.

In a further aspect of the present invention the special material properties, which result from using directions, which differ from the (111)-direction, should be considered in controlling the process during tempering. It has been shown that it is necessary to keep the temperature gradients significantly smaller than in the currently known tempering process for calcium fluoride not only during the holding stage, but also during the heat up and cool down stages of the tempering process in order to achieve smaller stress birefringence.

During the heat up stage heating rates are set less than 18 K/h according to the invention, preferably less than 12 K/h, but heating rates of less than 10 K/h are especially preferred. According to the invention it has now been found that small heating rates are essential in order to achieve good tempering results. It has been shown namely that during the heat up defects generated in the case of blanks that are not (111)-oriented are essentially more troublesome in the final product and are also essentially more difficult to relax (during the holding time).

According to the present invention very small cooling rates are maintained during cooling, which can be especially small in the upper temperature range and somewhat larger in the lower temperature range, which saves time and costs. The transition temperature, at which the cooling rate changed from a very small value to a small cooling rate, is between 900° C. and 600° C. The higher the quality of the product, the lower the transition temperature.

According to the invention cooling rates are maintained, which amount to less than 0.5 K/h, preferably less than 0.4 K/h, and especially preferably less than 0.3 K/h, in the upper temperature range of the cooling stage.

The cooling rates in the lower temperature range may not be increased over 3 K/h, preferably not over 2 K/h, and especially preferably not over 1.7 K/h, according to the invention.

Below the temperature range of 900° C. to 600° C. the cooling rate can be increased to minimize processing time and thus costs connected with it. The increase of the cooling rate can be performed in a single step. However it can also occur in several steps. The temperature rates in the lower temperature range according to the invention may not be increased over 3 K/h, preferably not over 2 K/h, and especially preferably not over 1.7 K/h, according to the invention.

The method according to the invention is suitable for making crystals of all forms and all orientations. Thus for example it is possible without more to obtain crystals that are stress-free in the (100)-direction or the (110)-direction instead of the (111)-direction, which has not been possible up to the present.

The invention also relates of the use of the crystals obtained by the method for optical purposes, especially as blanks and/or half-finished articles for optical elements. Microlithography, usually microlithography at <250 nm, especially at 248 nm and/or at 193 nm and preferably at 157 nm, is a preferred application of the crystals obtained by the method according to the invention.

The optical elements obtained according to the invention especially include prisms and lenses, which are used in optical arrangements, especially objectives. When they are used in microlithography and photography, generally steppers, excimer lasers, wafers and computer chips are made with them, as well as integrated circuits and electronic devices, which should contain those circuits and electronic devices.

The following example is illustrative of the method according to the invention, but should not be considered to limit the appended claims.

EXAMPLE

A single crystal made by the Bridgeman-Stockbarger method with a diameter of 250 mm and a height of 60 mm is placed in a graphite vessel. $PbF_2$ powder is added as a scavenger material. The residual moisture is removed from the processing chamber by a twelve-hour drying stage. Subsequently an $Ar/CF_4$ mixture is supplied to the apparatus until a pressure of 1050 mbar is reached. The pressure is controlled so that it is constant at a flow rate of 10 l/h throughout the entire process. The crystal is heated at a rate of 20 K/h to a temperature of 1130°. This temperature is maintained for 80 h. After that cooling takes place according to the following temperature recipe: Cooling to 900° C. with a rate of −0.3 K/h followed by cooling to 650° C. with a rate of −0.6 K/h followed by cooling to room temperature with a rate of −1.8 K/h. A crystal disk made according to this procedure had a stress birefringence of below 0.9 nm/cm (PV value) and 0.31 nm/cm (RMS value) in the (100)-direction. The RMS value of the uniformity of refractive index is $0.014 \times 10^{-6}$. The transmission at a wavelength of 157 nm is improved by about 5%.

The disclosure in German Patent Application 10 2004 008 752.0 of Feb. 23, 2004 is incorporated here by reference. This German Patent Application describes the invention described hereinabove and claimed in the claims appended hereinbelow and provides the basis for a claim of priority for the instant invention under 35 U.S.C. 119 (a) to (d).

While the invention has been illustrated and described as embodied in a method of making large-volume $CaF_2$ single crystals for optical elements with an optic axis parallel to the (100)- or (110)-crystal axis and $CaF_2$ single crystal made thereby, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. A method of making a highly uniform, low-stress calcium fluoride single crystal, said method including tempering the calcium fluoride single crystal and said method comprising the steps of:
   a) heating the calcium fluoride single crystal at a temperature increase rate of less than 18 K/h to a holding temperature between 1050° C. and 1350° C. to temper the crystal;
   b) holding the calcium fluoride single crystal at said holding temperature reached during the heating of step a) for a holding time of at least 65 hours;
   c) during the holding of step b), keeping static radial temperature gradients within the crystal less than 0.013 K/cm and static axial temperature gradients within the crystal less than 0.07 K/cm;
   d) after the holding of step b), cooling the calcium fluoride single crystal to a limiting temperature from 600° C. to 900° C. with a cooling rate that is at maximum equal to 0.5 K/h; and then
   e) cooling the calcium fluoride single crystal to temperatures below said limiting temperature with a cooling rate that is at maximum equal to 3 K/h.

2. The method as defined in claim 1, wherein said temperature increase rate during the heating is less than 10 K/h.

3. The method as defined in claim 1, wherein the tempering of the calcium fluoride single crystal occurs in an apparatus, in which a reducing atmosphere is present.

4. The method as defined in claim 1, wherein the tempering of the calcium fluoride single crystal occurs in the presence of at least one solid material selected from the group consisting of $PbF_2$, $ZnF_2$ and $XeF_2$.

5. The method as defined in claim 1, wherein temperature differences up to a maximum value of 0.3 K are present within the calcium fluoride single crystal during the cooling of the crystal from said holding temperature to said limiting temperature.

6. The method as defined in claim 1, wherein the calcium fluoride single crystal tempered in the tempering is in the form of a cylindrical body, independent from geometries of products formed later from the crystal.

7. The method as defined in claim 1, wherein the tempering occurs in an apparatus, and further comprising producing a vacuum of at least $10^{-4}$ mbar in the apparatus prior to the tempering in order to remove residual moisture and providing a pressure of 10 to 1050 mbar in the apparatus during the tempering.

8. The method as defined in claim 1, wherein the low-stress calcium fluoride single crystal has an optical quality that is sufficient for optical applications in directions different from a (111)-direction and said directions different from said (111)-direction include a (100)-direction and a (110)-direction.

9. The method as defined in claim 1, wherein the low-stress calcium fluoride single crystal has an RMS average value of refractive index uniformity ($\Delta n$) less than $0.025 \times 10^{-6}$ in a (100)-direction or a (110)-direction and a PV value of stress birefringence of less than 2.5 nm/cm and an RMS average value of the stress birefringence of less than 1 nm/cm in the (100)-direction or the (110)-direction.

10. The method as defined in claim 9, wherein the low-stress calcium fluoride single crystal has a PV value of the stress birefringence of less than 0.5 nm/cm and an RMS average value of the stress birefringence of less than 0.15 nm/cm in the (111)-direction.

11. The method as defined in claim 10, wherein said PV value of the stress birefringence is less than 0.2 nm/cm and said RMS average value of the stress birefringence is less than 0.08 nm/cm in the (111)-direction.

12. The method as defined in claim 1, further comprising covering the calcium fluoride single crystal with a graphite member during the tempering in order to reduce said static temperature gradient and said radial temperature gradient.

13. The method as defined in claim 12, wherein from said holding temperature to said limiting temperature said cooling rate is less than 0.3 K/h.

14. The method as defined in claim 1, wherein said holding time is at least 75 h.

* * * * *